(12) United States Patent
Sunohara et al.

(10) Patent No.: US 7,524,753 B2
(45) Date of Patent: Apr. 28, 2009

(54) SEMICONDUCTOR DEVICE HAVING THROUGH ELECTRODE AND METHOD OF MANUFACTURING THE SAME

(75) Inventors: Masahiro Sunohara, Nagano (JP); Mitsutoshi Higashi, Nagano (JP); Akinori Shiraishi, Nagano (JP); Hideaki Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 200 days.

(21) Appl. No.: 11/424,385

(22) Filed: Jun. 15, 2006

(65) Prior Publication Data

US 2006/0286789 A1    Dec. 21, 2006

(30) Foreign Application Priority Data

Jun. 17, 2005    (JP)    ............................ 2005-178534

(51) Int. Cl.
*H01L 21/44* (2006.01)
*H01L 29/40* (2006.01)

(52) U.S. Cl. ............... 438/598; 257/621; 257/E23.001; 257/E23.141; 257/E23.145

(58) Field of Classification Search ................. 438/455, 438/125, 598, 617, 675–679, 687; 257/700, 257/621, E31.075, E31.078, E31.081, E31.084, 257/E23.001, E23.141, E23.145
See application file for complete search history.

(56) References Cited

U.S. PATENT DOCUMENTS

| | | | |
|---|---|---|---|
| 5,933,712 A | * | 8/1999 | Bernhardt et al. ........... 438/125 |
| 6,039,889 A | | 3/2000 | Zhang et al. |
| 6,114,098 A | * | 9/2000 | Appelt et al. |
| 6,495,912 B1 | * | 12/2002 | Huang et al. ................. 257/700 |
| 2002/0190371 A1 | | 12/2002 | Mashino et al. |
| 2003/0232486 A1 | * | 12/2003 | Mashino ...................... 438/455 |
| 2004/0137705 A1 | | 7/2004 | Nemoto et al. |
| 2004/0238927 A1 | * | 12/2004 | Miyazawa |
| 2005/0001320 A1 | * | 1/2005 | Yamaguchi |

FOREIGN PATENT DOCUMENTS

| | | | |
|---|---|---|---|
| CN | 1531027 A | * | 9/2004 |
| CN | 1551344 A | * | 12/2004 |
| DE | 10244077 | | 3/2004 |
| EP | 1267402 | | 12/2002 |
| JP | 2003-169235 | | 6/2003 |
| JP | 2004-22990 | | 1/2004 |

* cited by examiner

Primary Examiner—Davienne Monbleau
Assistant Examiner—Monica D Harrison
(74) Attorney, Agent, or Firm—Rankin, Hill & Clark LLP

(57) ABSTRACT

A method of manufacturing a semiconductor device having a through electrode, includes forming through holes 36 in a substrate 31, forming a first metal layer 39 from one surface side of the substrate and pasting a protection film 40 on one surface of the substrate, forming through electrodes by filling the through holes with a second metal by means of an electroplating of the second metal 42 applied from other surface of the substrate while using the first metal layer as a power feeding layer, removing the protection film 40, and removing the first metal layer 39 located in areas other than peripheral portions of the through electrodes.

12 Claims, 5 Drawing Sheets

SEMICONDUCTOR DEVICE HAVING THROUGH ELECTRODE AND METHOD OF MANUFACTURING THE SAME

TECHNICAL FIELD

The present disclosure relates to a semiconductor device having a through electrode and a method of manufacturing the semiconductor device having the through electrode. The present disclosure can be applied as a three-dimensional packaging method, for example, that is applied to form through electrodes in a silicon substrate, in devices such as a CCD (charge coupled device) for receiving a light converged by a condensing lens, a CMOS device, a memory device, and the like and module parts such as a camera module, a memory multi-stage module, and the like.

RELATED ART

With the rapid progress and development of the information communication technology, improvement in a data communication speed and increase of an amount of data communication can be realized recently. Among the mobile electronic devices such as the cellular phone, the notebook personal computer, and the like, the mobile electronic device into which the imaging device having the image pickup device such as the CCD image sensor, the CMOS image sensor, or the like is incorporated is spreading now. These devices can transmit the image data picked up by the imaging device in addition to the character data in real time.

A sectional structure of the camera module (imaging device) in the related art is shown in FIG. 5. An upper view shows the module of the type in which the image pickup device and the substrate are connected by the wire bonding. A housing 12 having a condensing lens 11 in an opening portion at its one end is provided on a printed-circuit board 14 with an adhesive 13. In the inside of the housing 12, an image pickup device 1 (CCD or CMOS image sensor) in which a light receiving portion 15 is formed on an upper surface of a silicon substrate 16 is mounted on the printed-circuit board 14 with an adhesive 17. Electrode pads 18 are formed in the peripheral area of the light receiving portion 15 on the upper surface of the silicon substrate 16. The electrode pads 18 and terminal pads 20 on the printed-circuit board 14 are connected electrically via a bonding wire 19 respectively. Here, 21 denotes a passive element such as a chip capacitor, or the like, which is fixed to the printed-circuit board 14 on the outside of the housing 12 with solder.

Since a light is converged by the condensing lens 11 provided to one end of the housing 12 and then received by the light receiving portion 15 of the image pickup device 1, the imaging function of the optical device such as the camera, or the like can be fulfilled. In the device of the type that the electrode pads 18 provided to the peripheral area of the upper surface of the silicon substrate 16 and the terminal pads 20 on the printed-circuit board 14 are connected via the bonding wires 19, as shown in the upper view of FIG. 5, such a problem existed that a size of the device is increased.

In a lower view of FIG. 5, such a structure that through electrodes 22 are formed in the silicon substrate 16 is employed in place of the arrangement of the electrode pads on the periphery of the upper surface of the silicon substrate 16 of the image pickup device 1, and thus a size of the device can be decreased. More particularly, the through electrodes 22 are formed in the peripheral area of the silicon substrate 16 to pass through vertically, and then upper ends of the through electrodes 22 are connected electrically to the light receiving portion 15 and also lower ends of the through electrodes 22 are connected electrically to the terminal pads 20 via bumps 23. In this manner, the image pickup device 1 on the upper surface of which the light receiving portion 15 is formed is mounted on the printed-circuit board 14 by the flip-chip bonding, so that the light receiving portion 15 and the printed-circuit board 14 are connected electrically mutually. Thus, a space portion into which the bonding wires 19 are housed can be omitted. Accordingly, a size of the housing 12 can be reduced and also the camera module can be reduced in size as a whole from a size shown in the upper view of FIG. 5 to a size shown in the lower view of the same, as indicated by a broken line 25.

FIG. 6 is a fragmental detailed view of the lower view of FIG. 5, in which the through electrodes 22 are formed. Here, 24 is a wiring portion of the printed-circuit board 14, 125 is an IR-cut filter portion, and 26 is a transparent insulating layer.

In Japanese Patent Unexamined Publication No. 2003-169235 (which is hereinafter referred as Patent Literature 1), as the conventional example of the camera module using CCD, the imaging device has been proposed for the purpose of reducing the number of articles of the module parts, achieving a reduction in size and weight, and reducing a production cost. In this imaging device, the circuit board on which the cylindrical housing, the condensing lens fitted to the opening portion of the housing on one side to converge a light incident from the opening portion, and the sensor device fitted to the opening portion of the housing on the other side to receive the light converged by the condensing lens are mounted is fitted, and the circuit board and the housing are bonded at their boundaries. However, in this imaging device disclosed in Patent Literature 1, the sensor device and the circuit board are connected by using the bonding wires and thus there is a limit to a size reduction because a space portion into which the bonding wires are housed is needed.

Also, in Japanese Patent Unexamined Publication No. 2004-22990 (which is hereinafter referred as Patent Literature 2), as the conventional example in which the through electrodes are formed in the substrate, the through hole plugging method of forming the through holes in the silicon substrate and then filling the metal in the through holes by plugging using the plating has been proposed. According to this plugging method, in order to improve a density and adhesiveness of the plug metal by removing the fine voids generated in the plug metal, the metal is filled in the through holes in the silicon substrate by the electroplating, then both surfaces of the silicon substrate are planarized, and then the high-pressure annealing process is applied to the silicon substrate.

As described above, in the device of the type that the image pickup device and the circuit board are connected by the wire bonding as shown in the upper view of FIG. 5 and Patent Literature 1, there is a limit to the size reduction because the space portion into which the bonding wires are housed is needed.

SUMMARY

The disclosure below describes a semiconductor device having a through electrode and a method of manufacturing the semiconductor device having the through electrode, capable of achieving a cost reduction, a size reduction, an increase in density, and an increase in speed by improving and simplifying the method of forming through electrodes in the silicon substrate, when devices such as a CCD (charge coupled device), a CMOS device, a memory device, and the like and module parts such as a camera module, a memory multi-stage module, and the like are manufactured.

An example implementation of the invention is described below. A method of manufacturing a semiconductor device having a through electrode includes the steps of forming through holes in a substrate; forming a first metal layer on one surface of the substrate and providing an insulating protection film on the first metal layer; forming through electrodes by filling the through holes with a second metal by virtue of an electroplating of the second metal applied from other surface of the substrate while using the first metal layer as a power feeding layer; removing the insulating protection film; and removing the first metal layer located in areas other than peripheral portions of the through electrodes.

The substrate is a semiconductor substrate, a device layer and electrode pads are formed on the one surface of the semiconductor substrate, and the through holes are formed to pass through the electrode pads, a first insulating film provided under the electrode pads, and the substrate.

Before the through holes are formed in the semiconductor substrate, first opening portions from which the first insulating film is exposed are formed in the electrode pads by an etching and second opening portions from which the semiconductor substrate is exposed and areas of which are smaller than the first opening portions are formed by applying an etching to the first insulating film exposed from the first opening portions, and then the through holes whose sectional areas are smaller than the second opening portions are formed by applying the etching to portions of the semiconductor substrate exposed from the second opening portions.

After the through holes are formed in the substrate but before the first metal layer is formed on one surface of the substrate, a second insulating film is formed on an overall surface of the substrate containing inner walls of the through holes.

A resist is formed on one surface of the substrate other than peripheral portions of the through holes, then the second insulating film is formed on an overall surface of the substrate containing the inner walls of the through holes, then the resist and the second insulating film on the resist are removed, and then the first metal layer is formed. Alternately the second insulating film is formed on an overall surface of the substrate containing the inner walls of the through holes, then a resist is formed on peripheral portions of the through holes on one surface of the substrate, then the second insulating film not covered with the resist is removed by an etching, then the resist is removed, and then the first metal layer is formed.

The first metal layer is formed by a chromium and copper sputtering, and the second metal is formed by a copper plating.

Also, according to the present invention, there is provided a method of manufacturing a semiconductor device having a through electrode, which includes the steps of forming a device layer on one surface of a semiconductor substrate and forming electrode pads connected electrically to the device layer around the device layer; forming through holes to pass through the electrode pads, a first insulating film provided under the electrode pads, and the semiconductor substrate; covering an overall surface containing inner wall surfaces of the through holes, the first insulating film, and opening portions of the electrode pads with a second insulating film; removing the second insulating film from at least a part of areas of upper surfaces of the electrode pads; forming a first metal layer from one surface side of the semiconductor substrate to cover at least peripheries of the opening portions of the through holes such that a part of the first metal layer is connected electrically to the electrode pads; pasting an insulating tape on the first metal layer; forming through electrodes by filling the through holes with a second metal by virtue of an electroplating of the second metal applied from other surface of the semiconductor substrate while using the first metal layer as a power feeding layer; removing the insulating tape; and removing the first metal layer located in areas other than peripheral portions of the through electrodes.

Both the device layer and the electrode pads are formed on the first insulating film on the semiconductor substrate. Alternately, the device layer is formed directly on the semiconductor substrate, and the electrode pads are formed on the first insulating film on the semiconductor substrate.

DETAILED DESCRIPTION

An embodiment of the present invention will be explained in detail with reference to FIG. 1 to FIG. 4 hereinafter. FIGS. 1(a) to (d), FIGS. 2(a) to (d), and FIGS. 3(a) to (d) show a method of manufacturing a semiconductor device having a through electrode of the present invention in order of step.

Figure 1A:
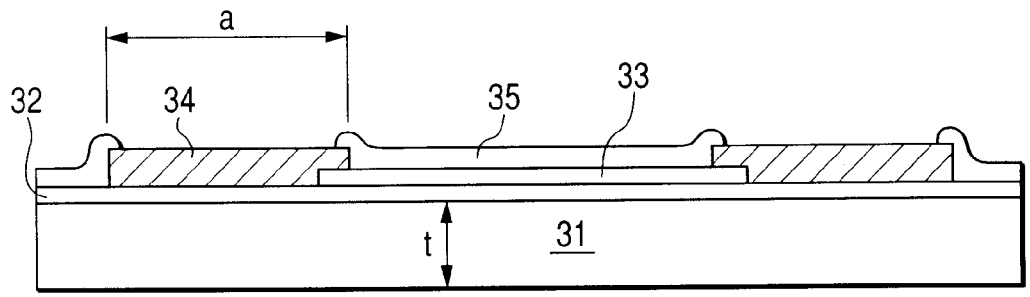
FIGS. 1(a) to (d) are sectional views showing a method of manufacturing a semiconductor device having a through electrode according to an embodiment of the present invention in order of step.

FIG. 1(a) shows a semiconductor wafer (wiring substrate) In this semiconductor wafer, an oxide film ($SiO_2$ film) 32 is formed as an insulating film that covers an upper surface of a silicon (Si) substrate (semiconductor substrate) 31. Then, a device layer 33 such as a CCD or CMOS image sensor, a memory, or the like is formed on the oxide film 32. Then, aluminum pads (electrode pads) 34 are formed around the device layer 33 on the oxide film 32 such that a part of them is overlapped with the device layer 33. Then, an insulating film (passivating film) 35 is formed thereon over a whole surface. Then, only the passivating film 35 located on the aluminum pads 34 is removed from areas that are slightly narrower than areas of the aluminum pads 34 respectively to expose the aluminum pads 34. In this case, a GaAs semiconductor and the like other than the silicon substrate may be employed as the substrate 31.

Here, by way of example, it is preferably that a thickness t of the silicon (Si) substrate 31 is set to 50 to 500 μm, for example, the aluminum pad 34 is shaped into a square a length a of one side of which is about 100 μm, for example, and a square area that is slightly narrower than the square is exposed from the passivating film 35.

Figure 1B:
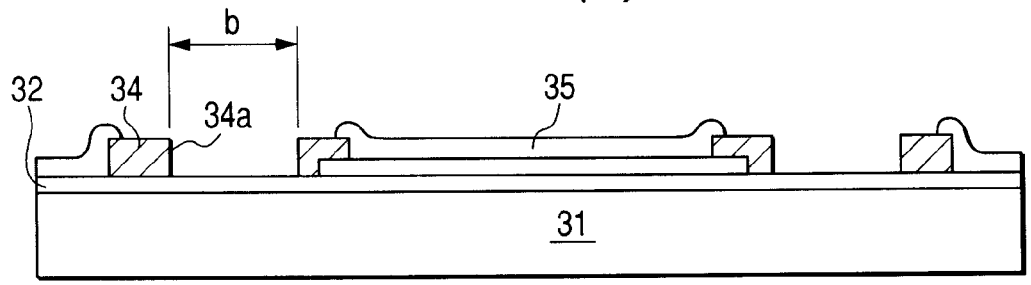

FIG. 1(b) shows a state that the aluminum pads 34 exposed from the passivating film 35 are removed by the etching. As the etching process in this case, for example, a resist (not shown) is coated on the whole surface, and then this resist is patterned by the exposing/developing. Then, the etching is applied to an upper surface of the semiconductor wafer by using a dry (Cl-based gas) or wet (phosphoric acid+acetic acid+hydrochloric acid) etchant or a Stanford etchant, which has no influence on the oxide film 32. Then, the resist is removed after the etching is finished. An opening portion 34a in the aluminum pad portion removed by such etching is a square a length b of one side of which is about 80 μm, for example, and thus the underlying oxide film 32 is exposed from the opening portion 34a.

Figure 1C:
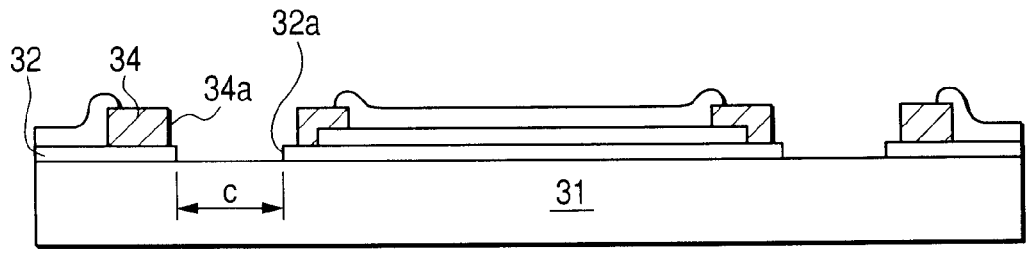

FIG. 1(c) shows a state that the oxide film 32 exposed from the opening portion 34a of the aluminum pads 34 is removed by the etching. As the etching process in this case, for example, a resist (not shown) is coated on the whole surface, and then this resist is patterned by the exposing/developing. Then, the etching is applied to an upper surface of the semiconductor wafer by using a dry ($CHF_3$ or $CF_4$) or wet (hydrofluoric acid) etchant, which has no influence on the silicon substrate 31. Then, the resist is removed after the etching is finished. A shape of the oxide film 32 removed by such etching is a square a length c of one side of which is about 60 μm, for example, and thus the upper surface of the silicon substrate 31 is exposed from the opening portion 32a of the oxide film 32 removed as a square.

Figure 1D:
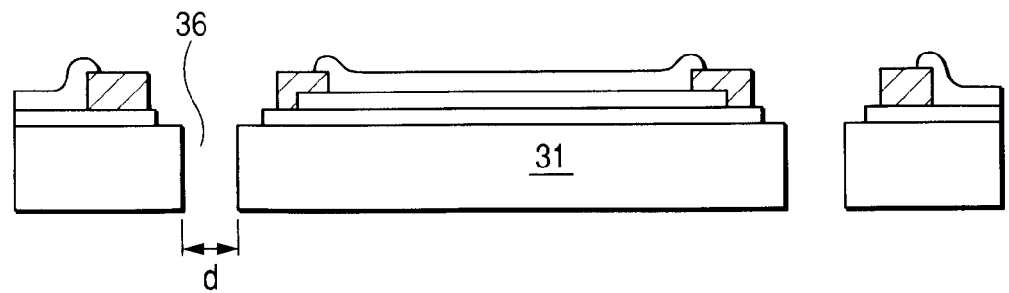

FIG. 1(d) shows a state that through holes 36 are formed in portions of the silicon substrate 31, which are exposed from the square opening portions 32a of the oxide film 32, by the hole opening process using the etching. As the etching process in this case, for example, a resist (not shown) is coated on the whole surface, and then this resist is patterned by the exposing/developing. Then, the etching is applied by using a dry ($SF_6$ gas) etchant. Then, the resist (not shown) is removed after the etching is finished.

When the hole opening process is applied to the silicon substrate 31 by the etching, such process is applied from the upper surface side of the semiconductor wafer on which the aluminum pads 34 are formed. But such process may be applied from the back surface of the silicon substrate 31. In this case, a resist (not shown) is coated on the back surface side of the silicon substrate 31, then this resist is patterned by the exposing/developing, and then an etchant is applied from the back surface side of the silicon substrate 31. In this manner, the etching applied from the back surface side of the silicon substrate 31 is advantageous to the point of view that the device layer 33 is hardly affected by the plasma etching.

According to such etching, the through holes 36 that pass through the silicon substrate 31 from the upper surface to the lower surface are formed in positions that correspond to the opening portions 32a the oxide film 32. The through hole 36 has an inner diameter d of about 40 μm, for example.

According to the above-mentioned structure, the inner wall of the through hole 36 has a stepwise section because of the different lengths b, c, d of the opening portions. With this stepwise inner wall of the through hole 36, it is possible to extend the distance between side walls of the opening portions 34a of the electrode pads 34 and side walls of the opening portions of the silicon substrate 31. Therefore, it is possible to secure a sufficient insulation between the electrode pads 34 and the silicon substrate 31. Further, compared with the case where the inner walls of the through holes are not the stepwise shape, that is, the lengths of the opening portions are the same, vertically straight portions of the inner walls become short. Therefore, in the case where an insulation film 38 and a metal layer 39 which are mentioned later are formed by spattering or CVD, it is possible to form sequentially these film and layer with a sufficient thickness. Therefore, it is possible to secure the sufficient electrical connection and also the sufficient insulation.

Figure 2A:
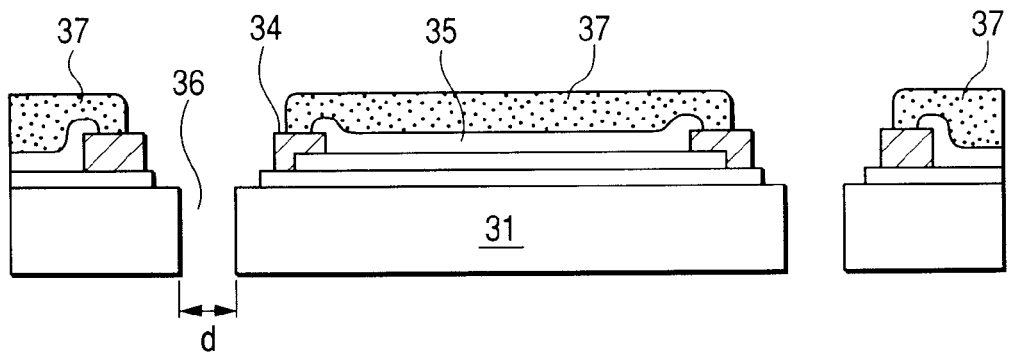
FIGS. 2(a) to (d) are sectional views showing the method of manufacturing the semiconductor device having the through electrode according to the embodiment of the present invention in order of step subsequently to FIG. 1.

FIG. 2(a) shows a state that resist patterns 37 are formed by coating a resist on the insulating film (passivating film) 35 and the aluminum pads 34 and then patterning this resist. More specifically, a resist is coated on the overall surface of the semiconductor wafer including the insulating film (passivating film) 35 and the aluminum pads 34, and then patterned by the exposing/developing such that the resist is removed from peripheral portions of the through holes including areas of the through holes 36 and the upper surface of the silicon substrate 31 around the through holes 36, exposed surfaces of the oxide film 32, and inner side portions of the aluminum pads 34. Thus, the resist patterns 37 for covering the whole surface of the passivating film 35 and a part of the aluminum pads 34 located adjacent to the passivating film 35 are formed.

Figure 2B:
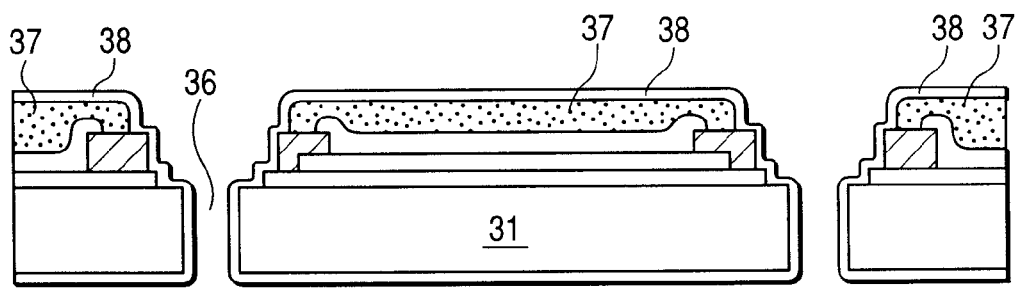

FIG. 2(b) shows a state that a thin insulating film 38 is formed on the overall surface of the semiconductor wafer including the lower surface of the silicon substrate 31 and inner wall surfaces of the through holes 36. Such insulating film 38 can be formed by applying the low-temperature chemical vapor deposition (CVD) from the upper and lower surfaces of the semiconductor wafer at 250° C., or less, for example. But the insulating film 38 may be formed on the overall surface of the semiconductor wafer by turning the semiconductor wafer upside down after CVD is applied from the upper surface of the semiconductor wafer, and then applying CVD from the lower surface. As the material of the insulating film 38 used in CVD, SiOx, SiNx, SiNOx, or the like can be employed. A thickness of the insulating film 38 is set to about 0.2 to 0.5 μm, for example. Accordingly, the insulating film 38 is formed on the overall surface of the semiconductor wafer including the inner walls of the through holes 36.

Figure 2C:
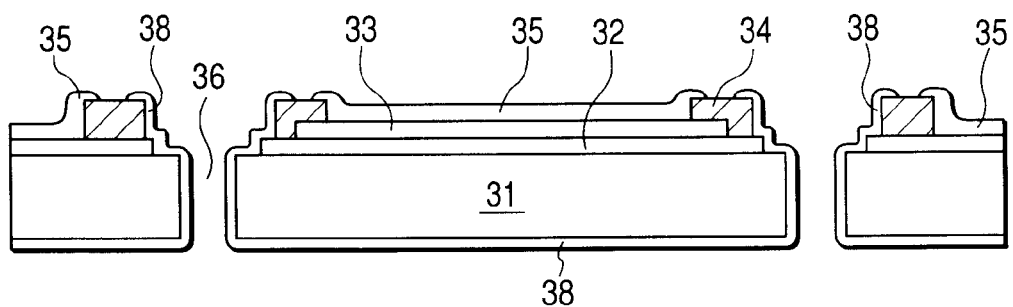

FIG. 2(c) shows a state that the resist patterns 37 formed in step in FIG. 2(a) are removed. In order to remove the resist patterns 37, it is advantageous to use the so-called lift-off method. According to the lift-off method, the resist patterns 37 are removed and simultaneously the insulating film 38 on the upper surface of the resist patterns 37 is also removed. As a result, the aluminum pads 34 are exposed partially and also the passivating film 35 for covering the device layer 33 is exposed. The inner surface sides of the through holes 36 and the back surface side of the semiconductor wafer are still covered with the insulating film 38.

In this case, steps in FIG. 2(a) to FIG. 2(c) can be replaced with following steps, for example. That is, in FIG. 2(a), first the resist patterns 37 are formed on the passivating film 35 and the aluminum pads 34. In this case, prior to the formation of the resist layers 37, the insulating film 38 in the step of FIG. 2(b) is formed on the overall upper and lower surfaces of the semiconductor wafer including the inner wall surfaces of the through holes 36. Then, a resist (not shown) is coated on the insulating film 38 and is patterned. Then, the insulating film 38 on the passivating film 35 and the insulating film on the aluminum pads 34 except end portions on the through holes 36 side are removed by etching the insulating film 38 using the patterned resist as a mask. Then, the used resist is removed. According to such steps, the semiconductor wafer similar to that shown in FIG. 2(c) can be formed by the approach other than the lift-off method.

Figure 2D:
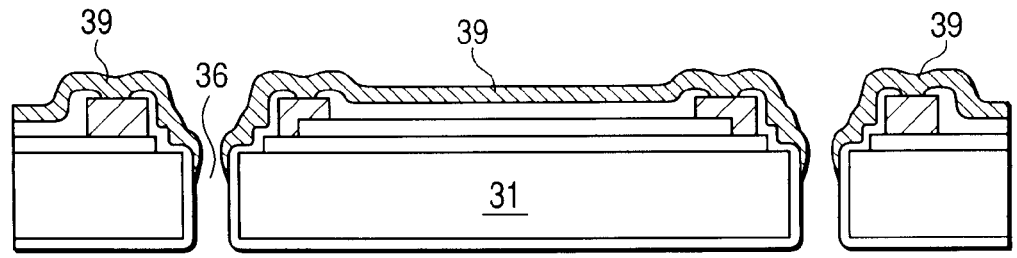
Figure 3A:
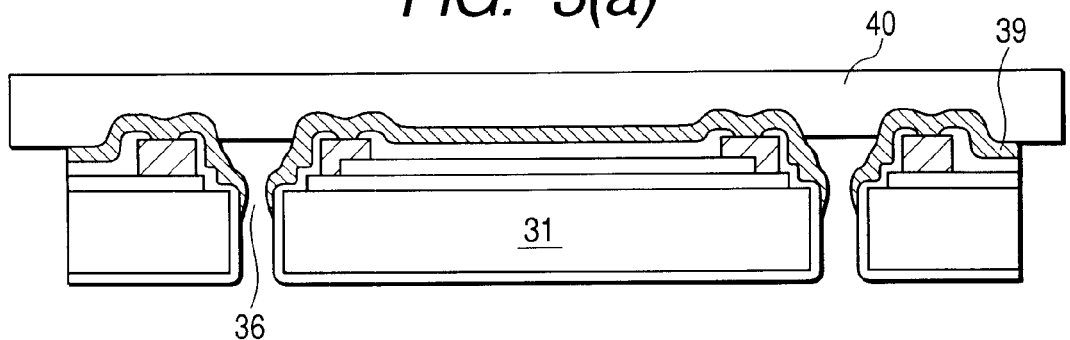
FIGS. 3(a) to (d) are sectional views showing the method of manufacturing the semiconductor device having the through electrode according to the embodiment of the present invention in order of step subsequently to FIG. 2.
Figure 3B:
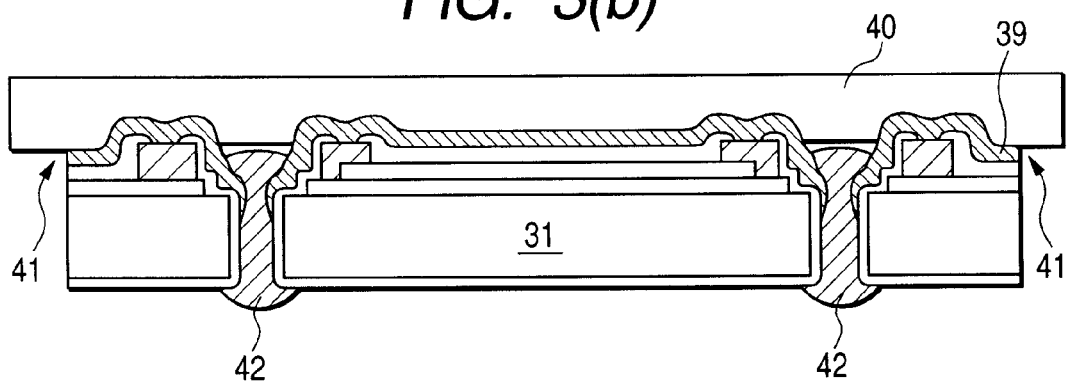
Figure 3C:
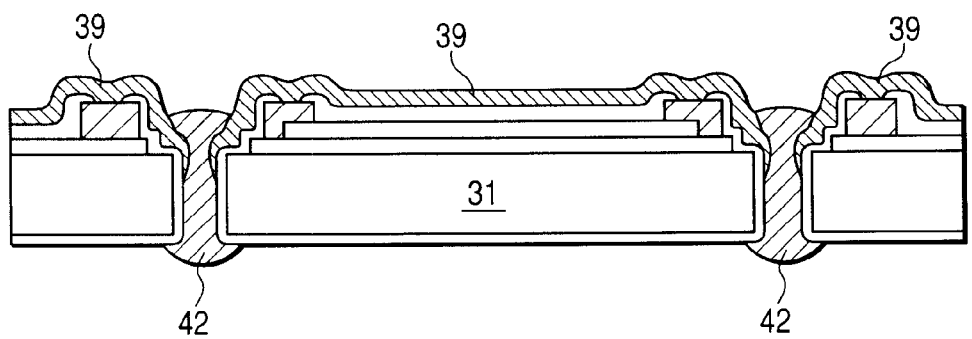
Figure 3D:
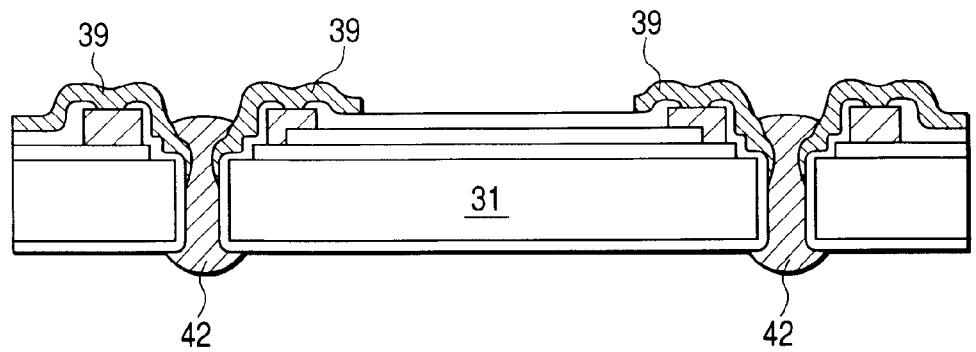

FIG. 2(d) shows a state that a metal film 39 is formed from the upper side of the semiconductor wafer by the sputtering. As the metal film 39, a chromium (Cr) film of 50 μm thickness, for example, is formed and a copper (Cu) film of 500 nm thickness, for example, is formed thereon. Since the metal film 39 is formed from the upper side of the semiconductor wafer by the sputtering, the overall upper surface of the semiconductor wafer is covered with the metal film 39 that is electrically conductive. In contrast, the metal film 39 is adhered onto only the inner walls of the through holes 36 on the upper portion of the semiconductor wafer, but the metal film 39 is never adhered onto most of the inner wall areas of the through holes 36 and the lower surface of the wafer.

FIG. 3(*a*) shows a state that a protection film 40 is pasted onto the upper surface of the wafer. A proper pressure (e.g., 1 MPa) is applied to the material made of an insulating resin, e.g., a UV release tape, or the like, at a proper temperature (e.g., 150° C.) by the thermal press. Thus, this protection film 40 is pasted onto the overall area of the upper surface of the wafer.

FIG. 3(*b*) shows a state that through electrodes 42 are formed by applying the electrolytic copper plating from the back surface of the wafer, while feeding an electroplating power from the end portions of the metal film 39 formed on the overall area of the upper surface of the wafer, as indicated with an arrow 41. In this manner, since the metal film 39 is formed on the overall area of the upper surface of the wafer, the copper (Cu) electroplating can be applied by using the metal film 39 over the through holes 36 as one electrode. Thus, the insides of the through holes 36 are filled completely with the copper and the through electrodes 42 can be formed. In contrast, since the upper surface of the wafer is protected with the protection film 40, the copper is never adhered onto the upper surface of the wafer, e.g., the metal film 39 existing on the passivating film 35, and the like by the electroplating.

FIG. 3(*c*) shows a state that the protection film 40 pasted onto the upper surface of the wafer is removed by the ultraviolet irradiation. This is because the metal film 39 used as the power feeding layer in the electroplating must be removed partially by subsequent step.

FIG. 3(*d*) shows a state that the metal film 39 is removed from the areas except the peripheral portions of the through holes 36. The etching of the copper (Cu) and chromium (Cr) is applied to remove partially the metal film 39 in this manner. As this etching method, as well known, a resist (not shown) is coated on the overall area of the upper surface of the wafer, and then this resist is patterned by the exposing/developing. Then, the etching is applied while using the dry or wet etchant of the Stanford etchant. Then, the resist is removed after the etching is completed. As a result, the overall conduction on the upper surface of the wafer via the metal film 39 is cut off, and only the through electrodes 42 in the through holes 36 and the terminal portions on the upper and lower surfaces of them still remain as the conduction portions. In this case, wirings may be formed on the passivating film 35 by etching the metal film to shape the wiring patterns.

After this, individual semiconductor devices are obtained by applying the dicing to predetermined portions of the semiconductor wafer.

As described above, the semiconductor device (wiring substrate) having the through electrode of the present invention can be manufactured through respective steps in FIGS. 1(*a*) to (*d*), FIGS. 2(*a*) to (*d*), and FIGS. 3(*a*) to (*d*).

Figure 4:
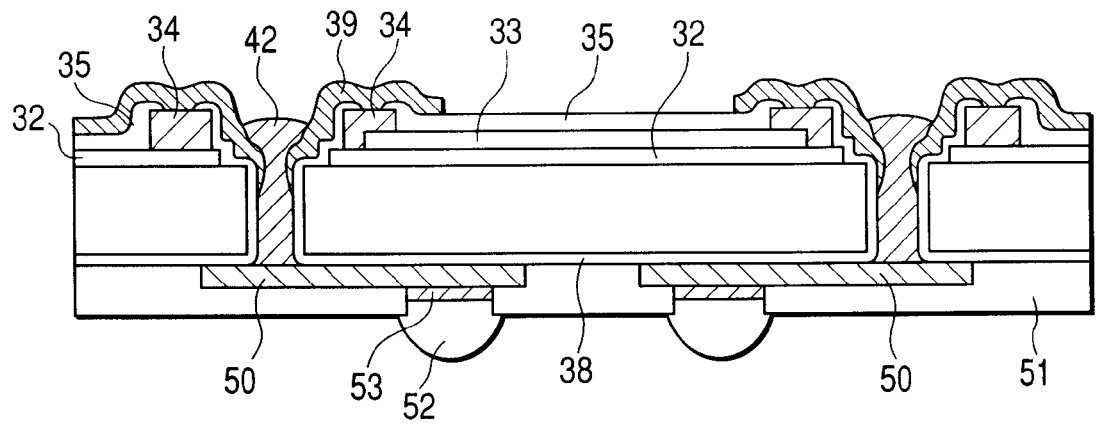
FIG. 4 is a sectional view showing the semiconductor device using the wiring substrate manufactured by the present invention.
Figure 5:
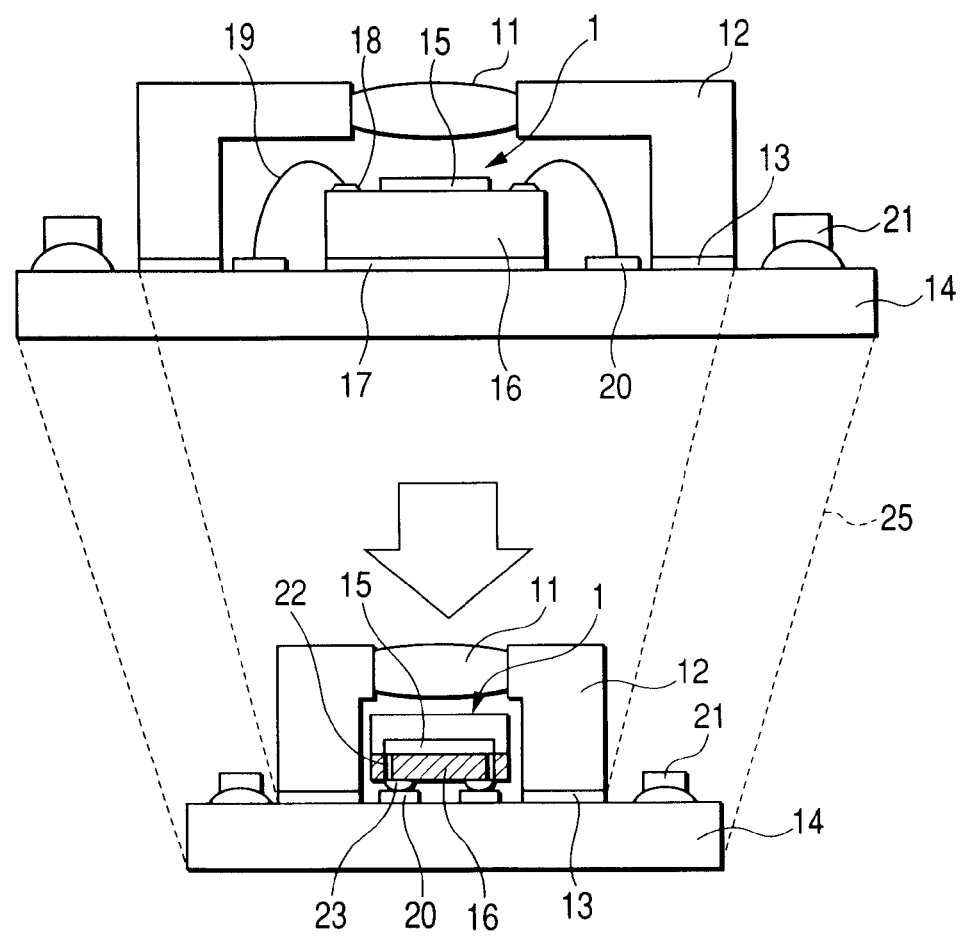
FIG. 5 is a view showing a camera module having the through electrode manufactured in the related art.
Figure 6:
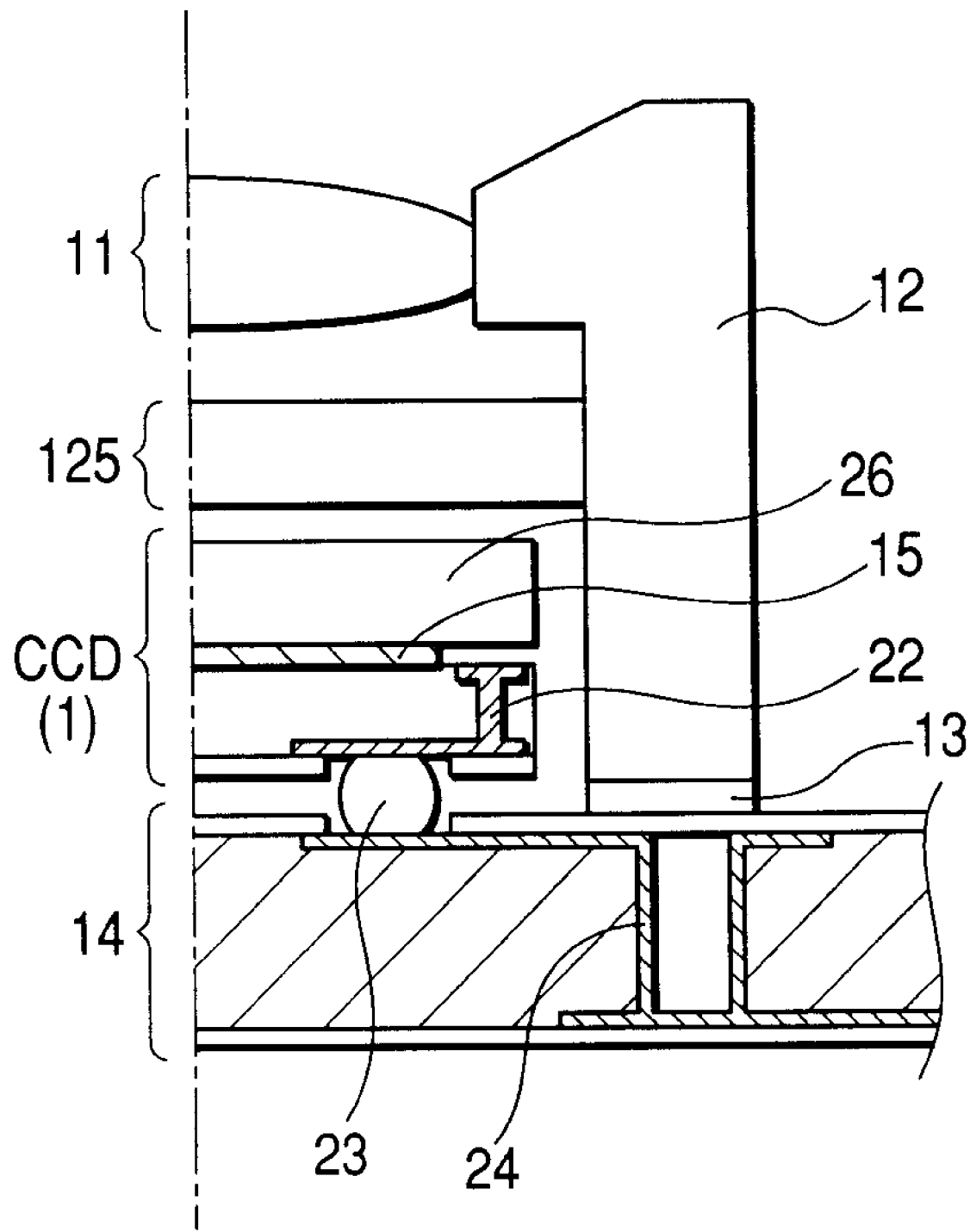
FIG. 6 is a fragmental detailed view of a lower view of FIG. 5.

FIG. 4 shows the case where the semiconductor device having rewirings on its back surface is formed by using the semiconductor device (wiring substrate) manufactured by above steps. Such semiconductor device can be manufactured by following steps, for example.

The through electrodes 42 protruded from the bottom portions of the through holes 36 are planarized by polishing the back surface of the semiconductor wafer in a state of FIG. 3(*d*). Then, a copper (Cu)/chromium (Cr) film is formed on the back surface of the wafer by the sputtering. Then, rewiring portions 50 are formed by coating a resist (not shown) and patterning the resist by means of the exposing/developing.

Then, a resist 51 is coated, and this resist 51 is patterned to expose only the portions in which external connection terminals are formed. Then, a nickel (Ni)/gold (Au) plating 53 is applied to the forming portions of the external connection terminal on the rewiring portions 50, and then solder bumps 52 acting as the external connection terminals are formed thereon. In turn, the dicing is applied to predetermined portions of the semiconductor wafer. In this manner, the semiconductor device having the rewirings on the back surface shown in FIG. 4 is obtained.

With the above, the embodiment the present invention is explained with reference to the accompanying drawings. But the present invention is not limited to the above embodiment, and can be varied, modified, etc. into various modes within a spirit and a scope of the present invention. In this case, in the actual steps of manufacturing the semiconductor device, the through electrodes are formed in the semiconductor wafer and then the individual semiconductor devices are manufactured by cutting away the wafer by means of the dicing.

Also, in the above embodiment, the case where both the device layer 33 and the electrode (aluminum) pads 34 are formed on the first insulating film (oxide film 32) on the silicon substrate 31 is explained. However, in some cases the device layer 33 is formed directly on the silicon substrate 31 depending upon the devices such as the transistor, and the like. In this case, the first insulating film (oxide film 32) is formed below the electrode pads 34.

As described above, according to the present invention, the through electrodes can be formed in the silicon substrate in the devices such as a CCD (charge coupled device), a CMOS device, a memory device, and the like and the module parts such as a camera module, a memory multi-stage module, and the like by a simple method, and also a cost reduction, a size reduction, an increase in density, and an increase in speed can be achieved.

What is claimed is:

1. A method of manufacturing a semiconductor device having a through electrode, comprising the steps of:
   forming a through hole in a substrate;
   forming a first metal layer on one surface of the substrate and providing an insulating protection film on the first metal layer;
   forming the through electrode by filling the through hole with a second metal, wherein the electrode forming step comprises the steps of electroplating the second metal, which is applied from the other surface of the substrate, while using the first metal layer as a power feeding layer;
   removing the insulating protection film; and
   removing the first metal layer located in an area other than a peripheral portion of the through electrode.

2. The method of manufacturing the semiconductor device according to claim 1, further comprising the step of:
   forming a device layer and a first insulating film on the one surface of the substrate and forming an electrode pad above the first insulating film on the one surface of the substrate,
   wherein the substrate is a semiconductor substrate, and the through hole is formed to pass through the electrode pad, the first insulating film provided under the electrode pad, and the substrate.

3. The method of manufacturing the semiconductor device according to claim 2, further comprising the step of:
   before forming the through hole in the semiconductor substrate, forming a first opening portion from which the first insulating film is exposed in the electrode pad by an etching, and forming a second opening portion from which the semiconductor substrate is exposed and an area of which is smaller than the first opening portion by applying an etching to the first insulating film exposed from the first opening portion, wherein the through hole whose sectional area is smaller than the second opening portion is formed by applying the etching to a portion of the semiconductor substrate exposed from the second opening portion.

4. The method of manufacturing the semiconductor device according to claim 1, further comprising the step of:

after forming the through hole in the substrate but before forming the first metal layer on the one surface of the substrate, forming a second insulating film on an overall surface of the substrate containing an inner wall of the through hole.

5. The method of manufacturing the semiconductor device according to claim 4, further comprising the steps of:

before forming the second insulating film, forming a resist on the one surface of the substrate other than a peripheral portion of the through hole; and removing the resist and the second insulating film on the resist, wherein the first metal layer is formed after the removing step.

6. The method of manufacturing the semiconductor device according to claim 4, further comprising the steps of:

after forming the second insulating film, forming a resist on a peripheral portion of the through hole on the one surface of the substrate; and removing the second insulating film not covered with the resist by an etching and then removing the resist, wherein the first metal layer is formed after the removing step.

7. The method of manufacturing the semiconductor device according to claim 1, wherein the first metal layer is formed by a chromium and copper sputtering, and the second metal is formed by a copper plating.

8. A method of manufacturing a semiconductor device having a through electrode, comprising the steps of:

forming a device layer on one surface of a semiconductor substrate and forming an electrode pad connected electrically to the device layer around the device layer;

forming a through hole to pass through the electrode pad, a first insulating film provided under the electrode pad, and the semiconductor substrate;

covering an overall surface containing an inner wall surface of the through hole, the first insulating film, and an opening portion of the electrode pad with a second insulating film;

removing the second insulating film from at least a part of an area of an upper surface of the electrode pad;

forming a first metal layer from one surface side of the semiconductor substrate to cover at least a periphery of the opening portion of the through hole such that a part of the first metal layer is connected electrically to the electrode pad;

pasting an insulating tape on the first metal layer;

forming a through electrode by filling the through hole with a second metal by virtue of an electroplating of the second metal applied from other surface of the semiconductor substrate while using the first metal layer as a power feeding layer;

removing the insulating tape; and removing the first metal layer located in an area other than a peripheral portion of the through electrode.

9. The method of manufacturing the semiconductor device according to claim 8, wherein both the device layer and the electrode pad are formed on the first insulating film on the semiconductor substrate.

10. The method of manufacturing the semiconductor device according to claim 8, wherein the device layer is formed directly on the semiconductor substrate, and the electrode pad are formed on the first insulating film on the semiconductor substrate.

11. A semiconductor device comprising:

a semiconductor substrate;

a device layer formed on one surface of the semiconductor substrate;

an electrode pad formed on the one surface of the semiconductor substrate and electrically connected with the device layer;

a first insulating film under the electrode pad on the one surface of the semiconductor substrate;

a through hole passing through the electrode pad, the first insulating film and the semiconductor substrate, and having an inner wall with a stepwise section;

a second insulating film formed on other surface of the semiconductor substrate, the inner wall of the through hole and a peripheral portion of the through hole on the one surface of the semiconductor substrate;

a through electrode formed in the through hole covered by the second insulating film; and a metal layer formed on the peripheral portion of the through hole on the one surface of the semiconductor substrate and electrically connecting the electrode pad to the through electrode.

12. The semiconductor device according to claim 11, wherein the through hole has a diameter smaller at a portion passing through the first insulating film than a portion passing through the electrode pad, and smaller at a portion passing through the semiconductor substrate than the portion passing through the first insulating film.

* * * * *